(12) United States Patent
Wang et al.

(10) Patent No.: US 6,376,308 B1
(45) Date of Patent: Apr. 23, 2002

(54) PROCESS FOR FABRICATING AN EEPROM DEVICE HAVING A POCKET SUBSTRATE REGION

(75) Inventors: Fei Wang; David K. Foote, both of San Jose; Bharath Rangarajan, Santa Clara; George Kluth, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/487,073

(22) Filed: Jan. 19, 2000

(51) Int. Cl.[7] .......................................... H01L 21/8247
(52) U.S. Cl. ...................................... 438/261; 438/307
(58) Field of Search .............................. 438/261, 307, 438/529, FOR 163, FOR 204

(56) References Cited

U.S. PATENT DOCUMENTS

| | | | |
|---|---|---|---|
| 3,997,367 A | * | 12/1976 | Yau |
| 5,985,718 A | * | 11/1999 | Dalla Libera et al. |
| 6,074,917 A | * | 6/2000 | Chang et al. |
| 6,133,095 A | * | 10/2000 | Eitan et al. |
| 6,153,477 A | * | 11/2000 | Gardner et al. |
| 6,180,471 B1 | * | 1/2001 | Chang et al. |
| 6,232,182 B1 | * | 5/2001 | Sugaya |
| 6,232,191 B1 | * | 5/2001 | Jeng et al. |

* cited by examiner

Primary Examiner—George Fourson
Assistant Examiner—Joannie Adelle Garcia

(57) ABSTRACT

A process for fabricating an EEPROM device having pocket substrate regions includes forming a pattern composite layer overlying a principal surface of a semiconductor substrate. The pattern composite layer includes a dielectric layer and a resist layer overlying the dielectric layer. Processing is carried out to reduce the lateral dimension of the resist layer relative to the dielectric layer thereby exposing an upper surface of the dielectric layer. A doping process is carried out in which dopants penetrate the exposed upper surface of the dielectric layer and enter the semiconductor substrate immediately below the exposed upper surface of the dielectric layer. Upon conforming the pocket regions, an oxidation process is carried out to form bit-line oxide regions in the semiconductor substrate.

8 Claims, 6 Drawing Sheets

PROCESS FOR FABRICATING AN EEPROM DEVICE HAVING A POCKET SUBSTRATE REGION

CROSS REFERENCE TO RELATED APPLICATION

Related subject matter is disclosed in co-pending, commonly assigned patent application, "PROCESS FOR FABRICATING A SEMICONDUCTOR DEVICE HAVING A GRADED JUNCTION," having now U.S. Pat. No. 6,168,993 and filed on even date herewith.

FIELD OF THE INVENTION

This invention relates, generally, to a process for fabricating semiconduction devices and, more particularly, to processes for fabricating EEPROM devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

Product development efforts in EEPROM device technology have focused on increasing the programming speed, lowering programming and reading voltages, increasing data retention time, reducing cell erasure times and reducing cell dimensions. Silicon nitride in combination with silicon dioxide is known to provide satisfactory dielectric separation between the control-gate electrode and the channel region of the enhancement transistor, while possessing electrical characteristics sufficient to store electrical charge. During programming, electrical charge is transferred from the substrate to the silicon nitride layer located in an oxide-nitride-oxide (ONO) layer.

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

These devices require pocket regions near the source and drain regions on either side of the channel. Electrons are sourced from the pocket regions and injected into the nitride layer. As devices are scaled to smaller dimensions, it becomes more difficult to form the pocket regions at precise locations in the channel region. While the recent advances in EEPROM technology have enabled memory designers to double the memory capacity of EEPROM arrays using two-bit data storage, numerous challenges exist in the fabrication of material layers within these devices. In particular, the pocket regions must be carefully fabricated to avoid excessive overlap with the source and drain regions. Accordingly, advances in fabrication technology are necessary to insure proper function two-bit EEPROM devices as device dimensions are scaled to smaller values.

SUMMARY OF THE INVENTION

A process for fabricating an EEPROM device advantageously enables the formation of pocket implant regions in the EEPROM device by doping the substrate at an angle of instant normal to the substrate surface. The pocket implant regions are formed by penetrating dopants through a portion of a dielectric layer exposed by an overlying resist pattern. The pocket implant regions are formed in semiconductor substrate immediately below the exposed portions of the dielectric layer. By forming the pocket regions with a doping process carried out at normal incidence to the substrate surface, precisely formed pocket regions can be obtained.

In one form, a process of the invention includes providing a semiconductor substrate having a principal surface and forming a pattern composite layer having a first edge surface. The pattern composite layer includes a dielectric layer overlying the principal surface and a resist layer overlying the dielectric layer. The resist layer is processed to form a second edge surface laterally displaced from the first edge surface. The processing of the resist layer exposes an upper surface of the dielectric layer, which separates the first edge surface from the second edge surface. A process is then carried out to penetrate the upper surface of the dielectric layer with dopants to form a doped region in the semiconductor substrate.

Figure 1:
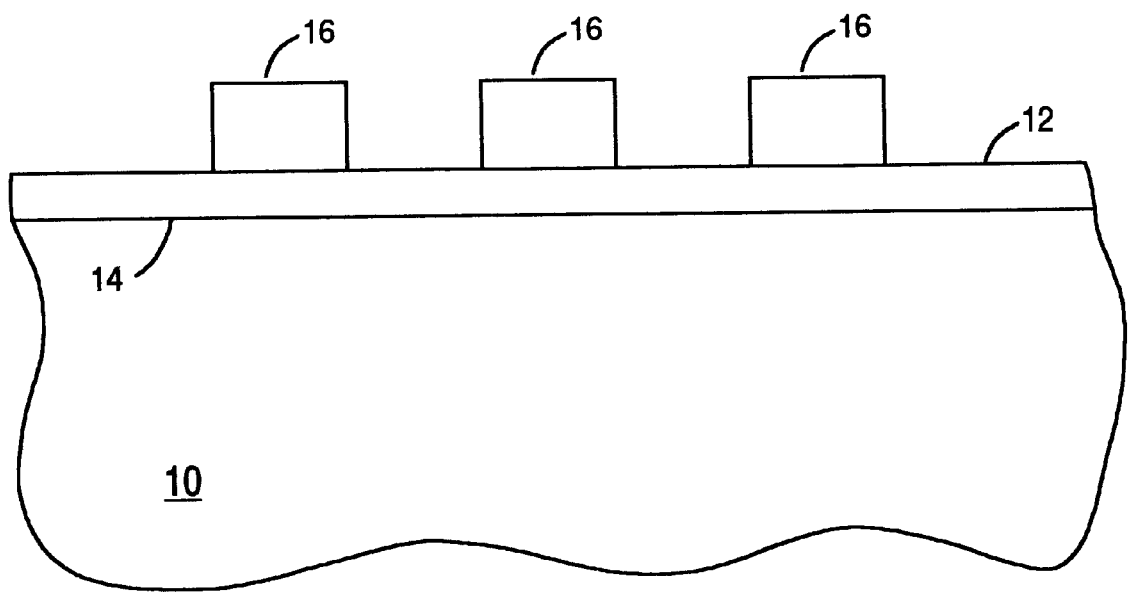
FIGS. 1–6 illustrate, in cross-section, processing steps in accordance with the invention.
Figure 2:
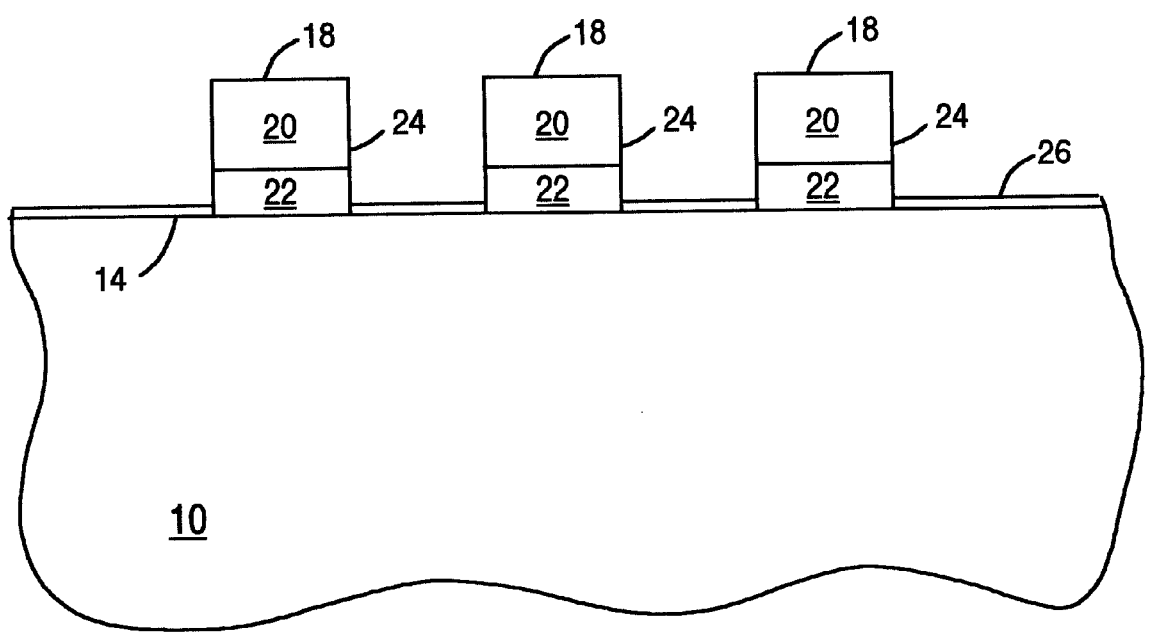

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PREFERRED EMBODIMENTS

Shown in FIG. 1, in cross-section, is a portion of a semiconductor substrate 10 having already undergone several processing steps in accordance with the invention. A dielectric layer 12 overlies a principal surface 14 of semiconductor substrate 10. Dielectric layer 12 can be any of a number of dielectric materials capable of preventing the thermal oxidation of principal surface 12. For example, dielectric 12 can be a silicon nitride layer, or a composite layer including silicon oxide and silicon nitride.

In a preferred embodiment of the invention, dielectric layer 12 is a silicon oxide-silicon nitride-silicon oxide (ONO) layer. The ONO layer has a preferred thickness of about 175 angstroms to about 250 angstroms. In the preferred embodiment of the invention, a first silicon oxide layer overlies principal surface 12 and has a preferred thickness of about 50 to about 80 Å. A silicon nitride layer overlies the first silicon oxide layer and preferably has a thickness of about 50 to about 80 Å. A second silicon oxide layer overlies the silicon nitride layer and has a preferred thickness of about 80 to about 110 Å. The individual layers of the ONO layer can be formed by any of several conventional processes for forming silicon oxide and silicon nitride. For example, the first silicon oxide layer can be thermally grown on principal surface 14, and the silicon nitride layer and second silicon oxide layer deposited by chemical-vapor-deposition (CVD) processes. Alternatively, an ONO layer can be formed by first forming a silicon oxide layer, then carrying out a nitrogenation process to form a silicon nitride region within the silicon oxide layer. Accordingly, all such processes are contemplated by the process of the invention.

A resist pattern 16 overlies dielectric layer 12. Resist pattern 16 can be formed of any of a number of resist materials that are capable of being isotropically etched. In a preferred embodiment of the invention, resist pattern 16 is formed by depositing a layer of photoresist material, exposing the photoresist material to a suitable wavelength of light, and developing the resist material to form a pattern overlying the surface of dielectric layer 12. The photoresist material can be any commonly-used photoresist material, such as a Novolak-resin material, and the like. In a preferred embodiment of the invention, the resist material is a positive-acting hydrocarbon resin that is reactive with an oxygen plasma. Preferably, resist pattern 16 has a thickness of about 3,000 to about 10,000 Å.

After forming resist pattern 16, an etching process is carried out to remove portions of dielectric layer 12 exposed by resist pattern 16. Preferably, dielectric layer 12 is anisotropically etched to form a pattern composite layer 18 overlying principal surface 14. Pattern composite layer 18 includes a resist portions 20 overlying dielectric portions 22. A first edge surface 24 is continuous with both resist portions 20 and dielectric portions 22.

During the anisotropic etching process, dielectric material is removed much faster in the vertical direction than in the horizontal direction. Accordingly, the etching process precisely reproduces the geometric features of resist pattern 16 in dielectric layer 12. Thus, precisely defined dielectric portions can be formed on principal surface 14 using resist pattern 16 as an etching mask. Preferably, the etching process is terminated prior to removing all of the dielectric material overlying principal surface 14. In the preferred processing embodiment, a buffer layer 26 remains overlying principal surface 14 upon completion of the anisotropic etching process. Buffer layer 26 will prevent contamination of semiconductor substrate 10 during subsequent doping processes.

Figure 3:
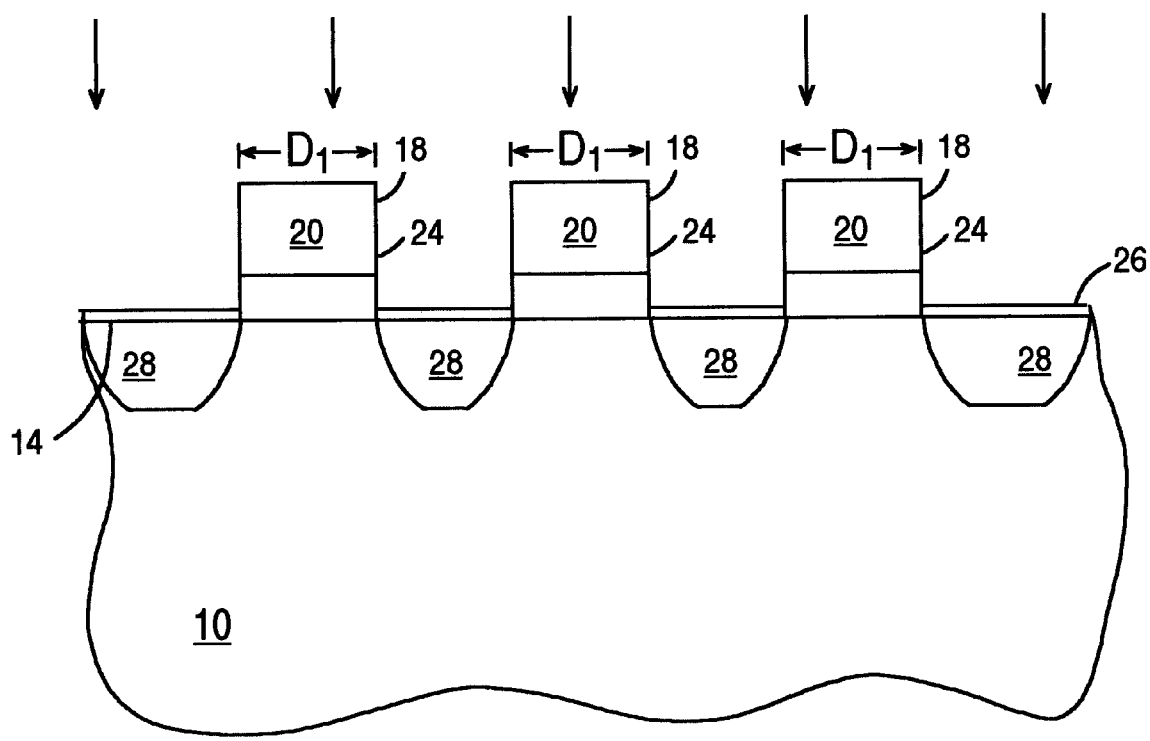
Figure 4:
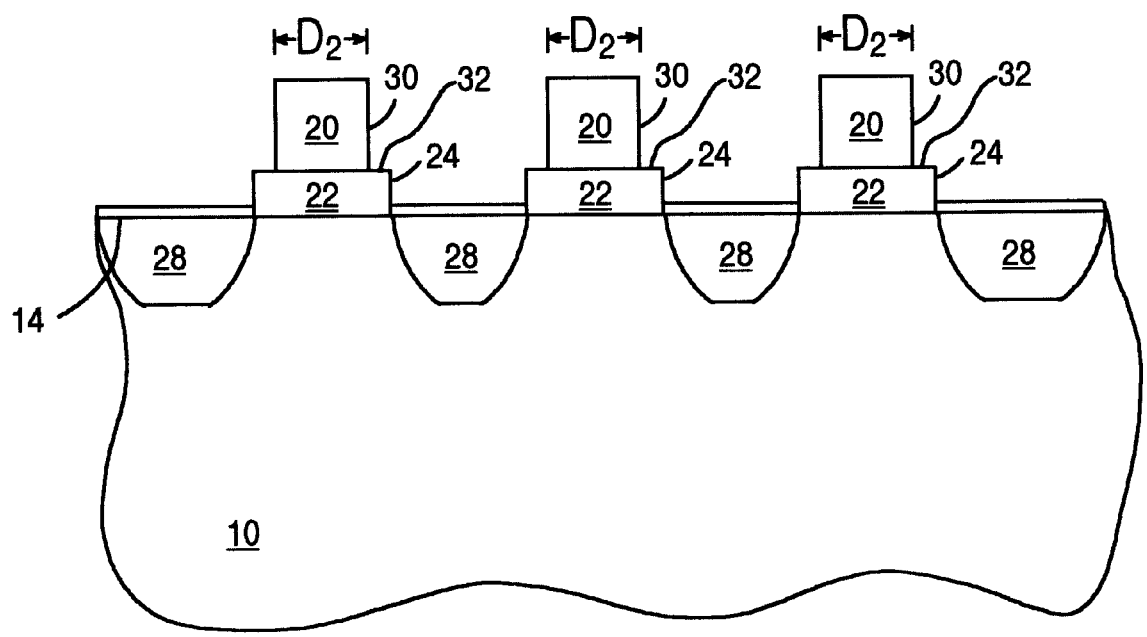
Figure 5:
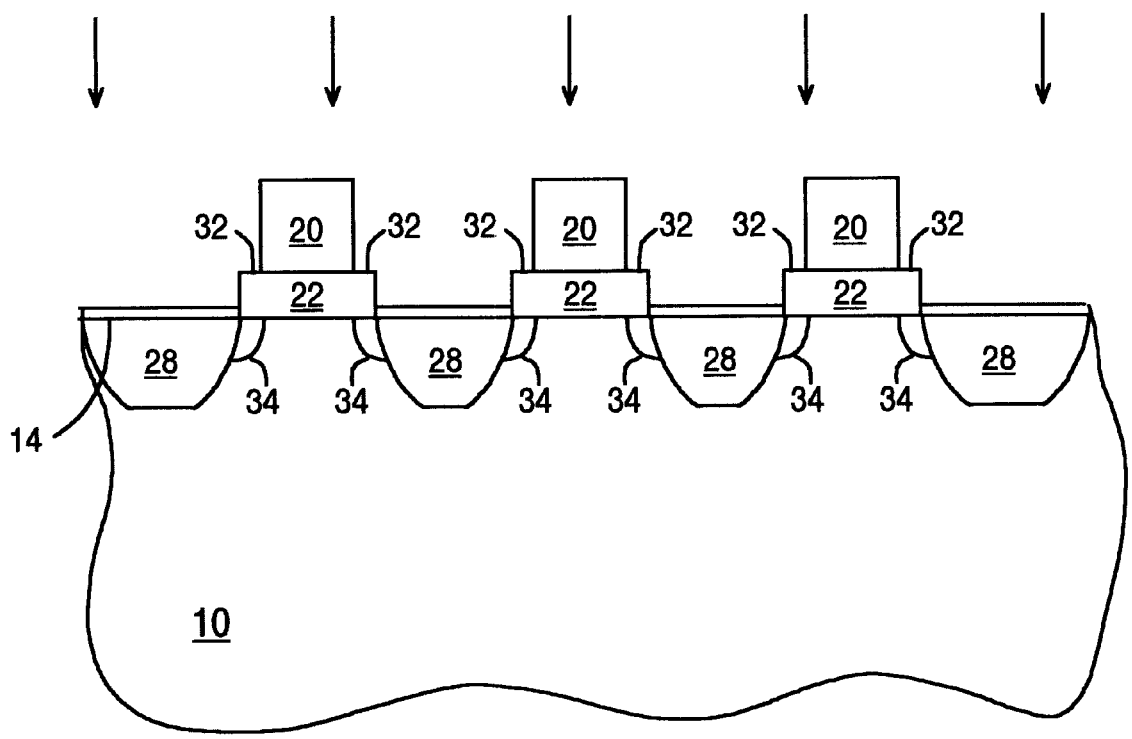

The process of the invention continues, as illustrated in FIG. 3, with the formation of doped regions 28 and semiconductor substrate 10. The doping process is carried out using pattern composite layer 18 as a doping mask. In a preferred embodiment of the invention, the doping process is carried out by ion implantation of an N-type dopant. Where the N-type dopant is arsenic, the ion implantation process is preferably carried out at an implant energy of about 30 to about 70 keV, and at a doping level of about 1E15 to about 5E15 ions/cm$^2$. Composite dielectric layer 18 effectively prevent dopant atoms from entering semiconductor substrate 10 in regions immediately underlying pattern composite layer 18.

In an alternative embodiment of the invention, the doping process used to form doped regions 28 can be carried out prior to etching dielectric layer 12. In this case, where ion implantation is used, an implant energy of about 60 to about 100 keV is necessary to penetrate dielectric layer 12 and place arsenic ions at a desired depth in semiconductor substrate 10.

Following the formation of doped regions 28, a process is carried out to selectively reduce the lateral dimension of resist portions 20 relative to dielectric portions 22. The resist processing changes the lateral dimensions of resist portions 20 from a first lateral dimension $D_1$ shown in FIG. 3 to a second lateral dimension $D_2$, such that lateral dimension $D_2$ is less than lateral dimension $D_1$. Additionally, the resist processing forms a second edge surface 30 that is laterally displaced from first edge surface 24. First edge surface 24 is separated from second edge surface 30 by an upper surface 32 of dielectric portions 22.

Preferably, resist portions 20 are isotropically etched to removed a predetermined amount of resist material from resist portions 20. In a preferred embodiment where resist portions 20 are photoresist, an oxygen plasma etching process can be carried out to isotropically etch resist portions 20. The oxygen plasma etching process is preferably carried out at a pressure of about 20 to about 200 millitorr and an RF power of about 300 to about 2,000 watts. Those skilled in the art will appreciate that numerous isotropic etching processes are commonly used in semiconductor fabrication. For example, numerous wet chemical etching techniques exist for isotropically etching materials, such as photoresist materials and the like. Accordingly, all such isotropic etching processes are within the scope of the present invention.

Once resist portions 20 are laterally reduced, a doping process is carried out to form pocket regions 34 in semiconductor substrate 10. The doping process is carried out by penetrating upper surface 32 of dielectric portions 22, such that pocket regions 34 are formed in semiconductor substrate 10 immediately below upper surface regions 32. In accordance with the invention, the amount of dopant introduced to form pocket regions 34 is insufficient to change the doping of doped regions 28. Accordingly, pocket regions 34 only appear in regions of semiconductor substrate 10 immediately below upper surface 32 of dielectric portions 22.

In a preferred embodiment of the invention, a boron ion implantation process is carried out at an energy of about 40 keV to about 70 keV to form pocket regions 34. Because the implant process is carried out through upper surface regions 32 of dielectric portions 22, the implant process can be carried out at an angle of incidence normal to principal surface 14. This process presents a distinct improvement over doping processes of the prior art used to form doped regions, such as pocket regions 34. In typical prior art processes, an ion implantation process is carried out at a large offset angle, such as an offset angle of about 15 to about 45° with respect to normal. By fabricating pocket regions 34 using a normal angle of incidence (0° tilt angle), doped regions 34 can be more precisely formed in semiconductor substrate 10.

Figure 6:
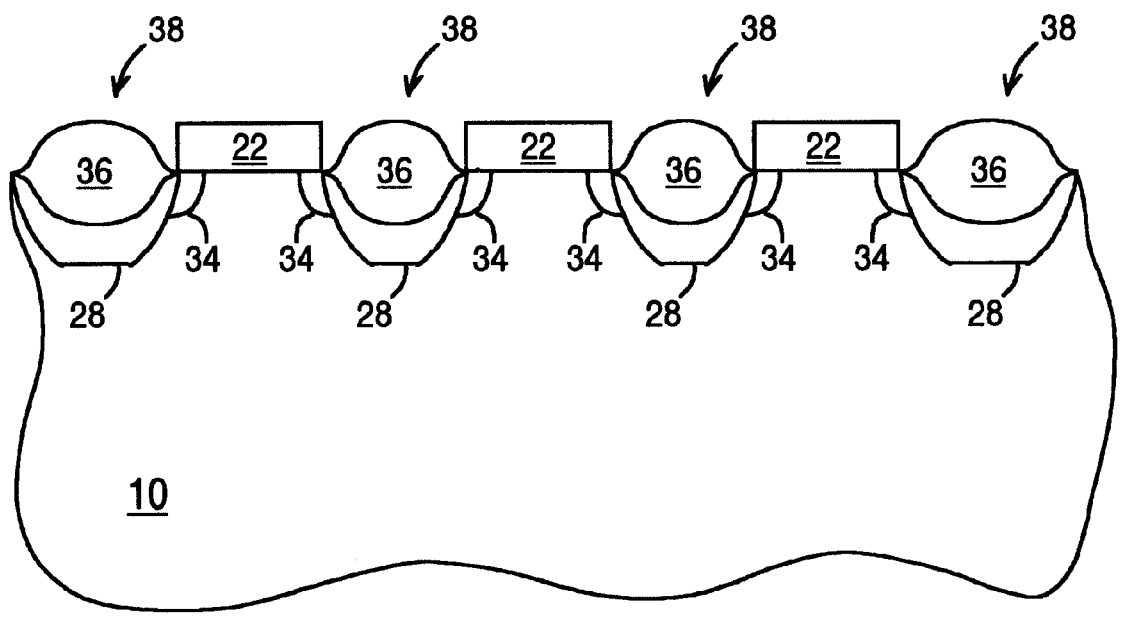

In accordance with the invention, processing continues, as illustrated in FIG. 6, to form isolation regions 36 at principal surface 14. To form isolation regions 36, resist portions 20 are removed by a conventional resist-stropping method, and preferably an oxidation process is carried out to oxidize portions of principal surface 14 exposed by dielectric portions 22. Isolation regions 36 overlie doped regions 28. During the oxidation process, dielectric portions 22 function to prevent the encroachment of the growing oxide layers along principal surface 14 in regions underlying dielectric portions 22.

Upon completion of the oxidation process, formation of a plurality of bit lines 38 in semiconductor substrate 10 is complete. Those skilled in the art will recognize that further commonly-used fabrication processes can be used to complete the fabrication of an EEPROM device. For example, a layer of gate electro-forming material can be deposited to overlie dielectric portions 22 and isolation regions 36 to form a control-gate electrode. Improved EEPROM device performance can be realized, in part, through the precise formation of pocket regions 34 according to the process of the present invention. Bit lines 38 include bit line oxide regions overlying the defused bit line regions in substrate 10 directly beneath the bit line oxide regions.

Thus, it is apparent that there has been described a process for fabricating an EEPROM device having pocket regions that fully provide the advantages set forth above. Although particular embodiments of the invention have been described in the foregoing description, it will be apparent to one skilled in the art that numerous modifications and variations can be made without departing from the spirit and scope of the invention. For example, various lithographic patterning techniques, such as deep-UV lithography, X-ray lithography, and the like, can be used. Furthermore, various resist materials, such as amplified resist, and composite resist and the like, can be used. Accordingly, all such variations and modifications are within the scope of the appended claims and equivalents thereto.

What is claimed is:

1. A process for fabricating an EEPROM device comprising the steps of:
    forming an ONO layer of the EEPROM device over a semiconductor substrate;
    forming a masking pattern overlying the ONO layer, the masking pattern having a first lateral dimension;
    etching the ONO layer using the masking pattern as an etching mask to form a patterned ONO layer, the first lateral dimension transferred to the patterned ONO layer;
    doping the semiconductor substrate to form buried bit-line regions in the semiconductor substrate;
    performing a plasma resist trimming process for reducing the first lateral dimension of the masking pattern to a second lateral dimension and exposing a surface portion of the patterned ONO layer, wherein the second lateral dimension is less than the first lateral dimension;
    doping the semiconductor substrate by ion implantation at an angle of incidence normal to a principle surface of the semiconductor substrate, using the patterned ONO layer as a doping mask, the dopant penetrating the exposed portion of the patterned ONO layer to form pocket regions in the semiconductor substrate; and
    oxidizing the semiconductor substrate to form bit-line oxide regions.

2. The process of claim 1, wherein the ion implantation comprises boron ion implantation.

3. The process of claim 2, wherein the step of forming an ONO layer comprises forming an ONO layer having a thickness of about 175 angstroms to about 250 angstroms, and wherein the boron is implanted at an implant energy of about 40 keV to about 70 keV.

4. The process of claim 1, wherein the step of forming a masking pattern comprises forming a photoresist pattern.

5. The process of claim 1, wherein the plasma resist trimming process comprises isotropic plasma etching using a mixture of oxygen and nitrogen etching gas.

6. A process for fabricating an EEPROM device comprising the steps of:
    providing a semiconductor substrate having a principal surface;
    forming a patterned composite layer having a first edge surface, said patterned composite layer including a dielectric layer overlying the principal surface and a resist layer overlying the dielectric layer, wherein the dielectric layer is an ONO layer of the EEPROM device;
    processing the resist layer, using a plasma etching process, to form a second edge surface laterally displaced from the first edge surface, wherein an upper surface of the dielectric layer separates the first edge surface from the second edge surface;
    penetrating the upper surface of the dielectric layer, by boron ion implantation at an angle of incidence normal to the principle surface of the semiconductor substrate, to form pocket regions in the semiconductor substrate; and
    oxidizing the semiconductor substrate to form bit-line oxide regions.

7. The process of claim 6 wherein the dielectric layer has a thickness of about 175 angstroms to about 250 angstroms, and wherein the boron ion implantation is performed at an implant energy of about 40 keV to about 70 keV.

8. A process for fabricating an EEPROM device comprising the steps of:
    providing a semiconductor substrate having a principal surface;
    forming a patterned composite layer that includes an ONO layer of the EEPROM device having a thickness of about 175 angstroms to about 250 angstroms, that overlies the principal surface and that includes a photoresist layer overlying the ONO layer;
    implanting dopant atoms to form buried bit-line regions in the semiconductor substrate using the patterned composite layer as a doping mask;
    trimming the photoresist layer by isotropically etching the resist layer using a mixture of oxygen and nitrogen etching gas to expose a surface portion of the ONO layer;
    implanting dopant atoms through the surface portion of the ONO layer by boron ion implantation ion at an angle of incidence normal to the principle surface of the semiconductor substrate and at an implant energy of about 40 keV to about 70 keV to form pocket implant regions in the semiconductor substrate;
    removing said photoresist layer; and
    oxidizing the semiconductor substrate to form bit-line oxide regions overlying the buried bit-line regions.

* * * * *